United States Patent
Isohata et al.

(10) Patent No.: US 6,288,489 B1
(45) Date of Patent: Sep. 11, 2001

(54) PLASMA DISPLAY DEVICE HAVING A HEAT CONDUCTING PLATE IN THE MAIN FRAME

(75) Inventors: Hideki Isohata; Hideo Kimura, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/196,110

(22) Filed: Nov. 20, 1998

(30) Foreign Application Priority Data

Mar. 25, 1998 (JP) .................................................. 10-077506

(51) Int. Cl.$^7$ ...................................................... H01J 17/49
(52) U.S. Cl. .............................. 313/582; 313/46; 362/294
(58) Field of Search .............................. 313/46, 493, 573, 313/582, 634; 362/294

(56) References Cited

U.S. PATENT DOCUMENTS 5,971,566 * 10/1999 Tani et al. ............................. 362/294

FOREIGN PATENT DOCUMENTS

| 0 821 385 | 1/1998 | (EP) . |
| 7-210093 | 8/1995 | (JP) . |
| 9-97015 | 4/1997 | (JP) . |
| 10-143082 | 5/1998 | (JP) . |

* cited by examiner

Primary Examiner—Nimeshkumar D. Patel
Assistant Examiner—Karabi Guharay
(74) Attorney, Agent, or Firm—Staas & Halsey LLP

(57) ABSTRACT

A plasma display device is comprised of a plasma display panel, a circuit board having a driving circuit for driving the plasma display panel, a main frame for supporting the circuit board, and a uniform heat-conducting plate to be fixed to the plasma display panel. In this structure, although the uniform heat-conducting plate is fixed to the plasma display panel by means of, for example, an adhesive, the main frame can be detached from the uniform heat-conducting plate when the plasma display panel is replaced. As a result, various complicated structures such as a radiating fin and a rib can be formed on the main frame because consideration of the possibility of discarding the main frame along with a PDP to be replaced is no longer necessary. By forming the uniform heat-conducting plate to be a simple structure so as to reduce its manufacturing cost, and by forming the main frame to have a complicated structure to improve its thermal nature and the mechanical strength, the present invention is able to realize a plasma display device having improved thermal characteristics and mechanical strength without largely increasing the manufacturing cost.

12 Claims, 7 Drawing Sheets

PLASMA DISPLAY DEVICE HAVING A HEAT CONDUCTING PLATE IN THE MAIN FRAME

BACKGROUND OF THE INVENTION

1. Field of the Invention

The present invention relates to a plasma display device using a plasma display panel (referred to as PDP, below). More particularly, it relates to a plasma display device having a new structure for supporting a PDP and for connecting a PDP with various driving circuits.

2. Description of the Prior Arts

Recently, plasma display devices have greatly attracted the attention of many people as a display device for a wall-mounted television. Although there are two kinds of PDP based on a difference in the driving methods, such as an AC type and a DC type, an AC type color plasma display device will be explained hereinafter only by way of example.

The AC type of plasma display device is comprised of a PDP and a main frame for supporting and holding circuit boards thereon. Various circuit components including circuits for driving the PDP are held on the circuit boards. Since the PDP is mainly comprised of two glass plates arranged in parallel with each other so as to hold a plasma forming gas therebetween, the main frame having circuit boards thereon and the PDP are fastened together using a binding material. In this case, however, when a defect is found in the PDP once it has been fastened to the main frame to form a plasma display device, the PDP and the main frame must be replaced together with new ones because the main frame cannot be separated easily from the PDP. Accordingly, the main frame should be designed by taking in account the possibility that it will be discarded. For this reason, the conventional main frame has been made in a simple form to reduce the manufacturing cost.

However, the main frame has other functions, such as to quickly and uniformly absorb the heat generated by the PDP so that the entire PDP surface is maintained at a uniform temperature, thus keeping the display quality of the PDP high, and to quickly move the absorbed heat to the outside of the device through heat conduction and radiation. In order to accomplish these functions, the main frame should be made from a material having a large thermal conductivity and should have a large surface area. However, since the possibility of discarding the main frame along with the PDP should be taken in account, as mentioned above, the main frame cannot have a complicated and high cost structure to increase the thermal conductivity and the surface area. Accordingly, the conventional main frame has been made of a relatively thin metal plate.

On the other hand, the main frame should have a high mechanical strength to protect the PDP from external stress since it is made of glass plates. As the panel size of the PDP increases, the metal plate must be made thicker to ensure the mechanical strength of the main frame and the PDP. In this case, however, a problem arises in keeping the panel flat. This is because the panel is easily broken due to stress arising from an uneven panel.

As mentioned above, the conventional plasma display device has various problems arising from coupling the PDP to the main frame.

SUMMARY OF THE INVENTION

The present invention has been made to overcome the above-mentioned problems of the prior art plasma display device.

Accordingly, the object of the present invention is to provide a plasma display device having a new structure for coupling a PDP to a main frame so as to solve the various problems arising from the prior art coupling structure without largely increasing the manufacturing cost.

To accomplish the above-mentioned object, the first feature of the present invention is a structure, or construction, of constructs a plasma display device having a PDP, a circuit board having a driving circuit for driving the PDP, a main frame for supporting the circuit board, and a uniform heat-conducting plate to be supported by said main frame and, at the same time, to be fixed to said PDP.

According to the first feature, the main frame and the uniform heat-conducting plate, which are detachably attached to each other, are provided between the circuit board and the PDP. Therefore, various structures for solving the above-mentioned problems can be provided on the main frame, which is easily separated from the uniform heat-conducting plate, when the PDP is replaced. Thus, the uniform heat-conducting plate, which is fixed to the PDP and can be discarded along with the PDP, can be formed in a simple form so as to reduce the manufacturing cost thereof. If the PDP must be replaced for some reasons after it has been incorporated into a plasma display device, only the PDP and the uniform heat-conducting plate, fixed to the PDP, must be discarded since the main frame is easily separated from the uniform heat-conducting plate.

In the second feature of the present invention, the uniform heat-conducting plate is fastened to the PDP using a binding material.

According to the second feature, the binding material fixes the PDP and the uniform heat-conducting plate closely, and improves the heat conduction between the PDP and the uniform heat-conducting plate. As a result, the heat generated by the PDP can be conducted to the uniform heat-conducting plate quickly and uniformly, and, further, conducted efficiently to the main frame via the uniform heat-conducting plate.

In the third feature of the present invention, the uniform heat-conducting plate is comprised of a plurality of convex and concave parts, which convex parts closely approach the PDP and which concave parts hold a binding material to adhere the uniform heat-conducting plate to the PDP.

According to the third feature, the mechanical strength of the uniform heat-conducting plate itself is increased due to the existence of the convex and concave parts and, at the same time, the required amount of the binding material can be reduced, thus realizing a low cost plasma display device. Since the uniform heat-conducting plate is structured to closely approach the PDP in the regions where no binding material exists, the heat conduction from the entire PDP surface to the uniform heat-conducting plate is kept excellent. Thus, the heat generated by the PDP is quickly and uniformly conducted to the uniform heat-generating plate and then to the main frame through the uniform heat-conducting plate.

In the fourth feature of the present invention, the uniform heat-conducting plate has a plurality of spacers on one surface to closely approach the PDP, and a binding material is placed between the respective spacers so as to fix the uniform heat-conducting plate to the PDP.

According to the fourth feature, the advantages obtained by the third feature of the present invention mentioned above can easily be obtained. The fourth feature of the present invention structures the convex parts of the third feature with the spacers. Although the uniform heat-conducting plate having the spacers according to the fourth feature do not have a remarkable advantage to increase the mechanical strength of the plate, it can be made easier than that of having the convex and concave parts because no processing is necessary for the plate. The same advantages as those obtained by the third feature can be obtained by the fourth feature with respect to heat conduction and uniform heat-conduction.

In the fifth feature of the present invention, the main frame has a plurality of tabs while the uniform heat-conducting plate has a plurality of sockets in which the corresponding tabs are inserted to detachably fix the main frame to the uniform heat-conducting plate.

In the sixth feature of the present invention, the tabs and the sockets are screwed together after the tabs have been inserted to the corresponding sockets.

According to the fifth and the sixth features of the present invention, the main frame and the uniform heat-conducting plate can easily be fixed together and detached from each other.

In the seventh feature of the present invention, the main frame has a heat radiating portion for efficiently dissipating the heat generated by the PDP to the outside of the device through heat radiation and heat conduction.

In the eighth feature of the present invention, the heat radiating portion includes a radiating fin.

According to the seventh and eighth features of the present invention, the heat generated by the PDP is efficiently dissipated from the radiating portion such as, for example, the radiating fin. Because these means for dissipating heat are affixed to the main frame which is detachably attached to the uniform heat-conducting plate fixed to the PDP, the cost of plasma display device according to the seventh or eighth feature does not increase even though the device is produced assuming the possibility of discarding the PDP and the plate.

In the ninth feature of the present invention, the main frame is comprised of a first rib formed along the outer periphery of the frame.

According to the ninth feature of the present invention, the mechanical strength of the main frame can be increased by the first rib formed along the outer periphery of the frame and, at the same time, the thickness of the main frame can be reduced in the part where no first rib is formed, thus decreasing the total weight of the plasma display device. In addition, the surface area of the main frame increases as a result of the first rib formation, and therefore, the first rib acts as a radiation part.

In the tenth feature of the present invention, the main frame has through hole penetrating between the front and the back surfaces of the main frame.

According to the tenth feature of the present invention, the main frame can be made to have a less weight than a main frame having no through hole.

In the eleventh feature of the present invention, the main frame is further comprised of a second rib formed along the periphery of the through hole.

According to the eleventh feature, the second rib formed along the periphery of the through hole prevents a decrease in the mechanical strength of the main frame due to the formation of the through hole. In addition, because the second rib increases the surface area of the main frame, it acts as a heat radiating portion.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be discussed with reference to the related figures.

There exist two different kinds of PDP, such as an AC type and a DC type, based on a difference in the driving method. Although the present invention can be adopted to both types, the AC type color PDP will be explained hereinafter by way of example.

Figure 1:
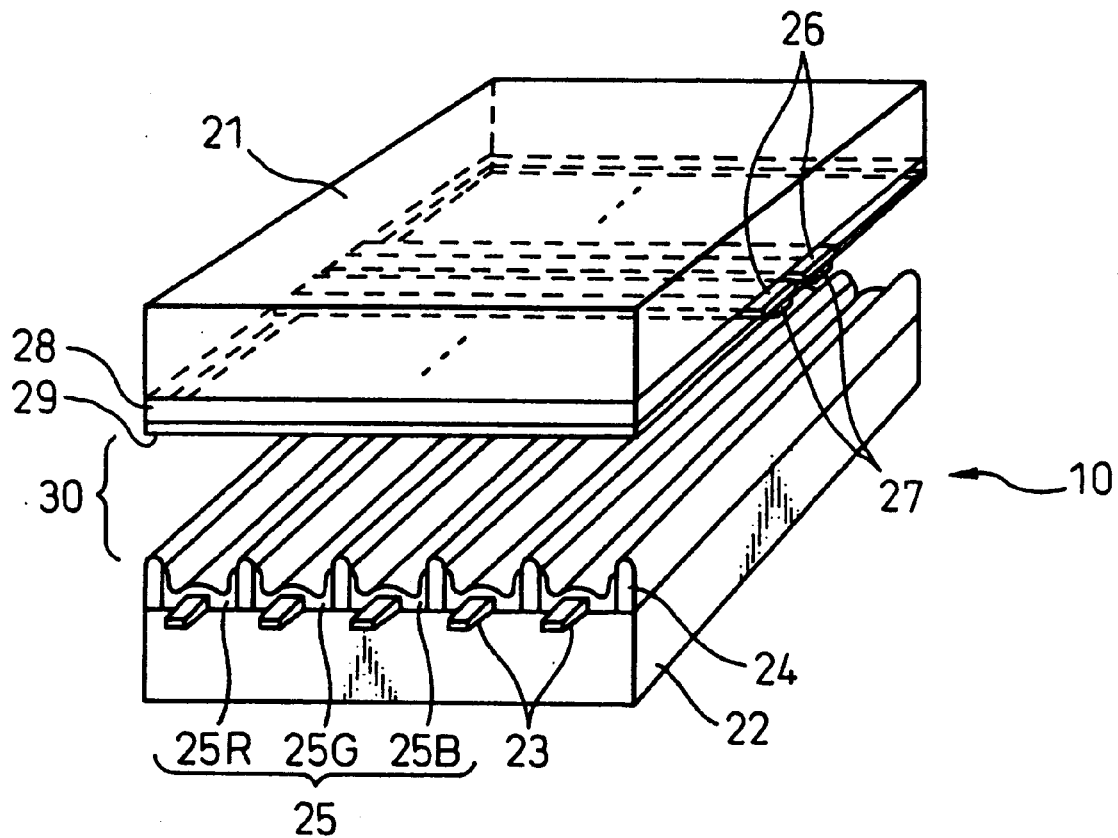
FIG. 1 is a view showing the internal structure of an AC type color PDP.

FIG. 1 is an oblique view for showing the internal structure of a conventional AC type color PDP. This type of color PDP is comprised of, for example, an AC type surface discharge panel having three electrodes. In fact, it is comprised of a front transparent substrate 21 made of glass and a back substrate 22 made of glass or ceramic. On one face of the back substrate 22, facing the front transparent substrate 21, a plurality of address electrodes 23 arranged in parallel to each other with predetermined separations, a plurality of belt-shaped ribs 24 disposed between two adjacent address electrodes 23, and a luminescent layer 25, are formed as shown in FIG. 1. This luminescent layer 25 covers the address electrodes 23, and also covers the respective side surfaces of the ribs 24 as well.

Luminescent layer 25 is comprised of a series of three different luminescent parts, for example, red luminescent parts 25R, green luminescent parts 25G and blue luminescent parts 25B, each of which emits a respective color of light under illumination by ultraviolet rays. These parts 25R, 25G and 25B are disposed among ribs 24 in a predetermined order.

On one surface of the front transparent substrate 21, facing the back substrate 22, a plurality of display electrodes (sustaining electrodes) 26 made from a transparent conductive material are formed in the direction to intersect the address electrodes 23. These display electrodes 26 are disposed in parallel with each other, and each display electrode forms an electrode pair with an adjacent address electrode 23. On each of the display electrodes 26, a metal bus electrode 27 is formed to increase the conductivity of the display electrodes. In addition, a dielectric layer 28 is formed to cover the display electrodes 26 and the bus electrodes 27. ITO (indium tin oxide) or tin oxide ($SnO_2$) can be used as a transparent conductive material to form the display electrodes 26, and the metal bus electrodes 27 are made of, for example, a three layer electrode of Cr—Cu—Cr. Further, the dielectric layer 28 is covered by a protection layer 29 made from magnesium oxide (MgO).

The front transparent substrate 21 and the back substrate 22 are so disposed that a gap 30 is formed between the protection layer 29 and the luminescent layer 25. This gap 30 is made air-tight to enclose a low pressure gas inside. This gas is comprised of a gas material which emits ultraviolet rays when activated to become a plasma. A gas made of two gas components, such as neon and xenon or helium and xenon, or three gas components, such as helium, argon and xenon or neon, argon and xenon, may be used as the plasma gas material. Using these gas materials, a PDP having a long life, a low operational voltage and a high brightness may be obtained.

Figure 2:
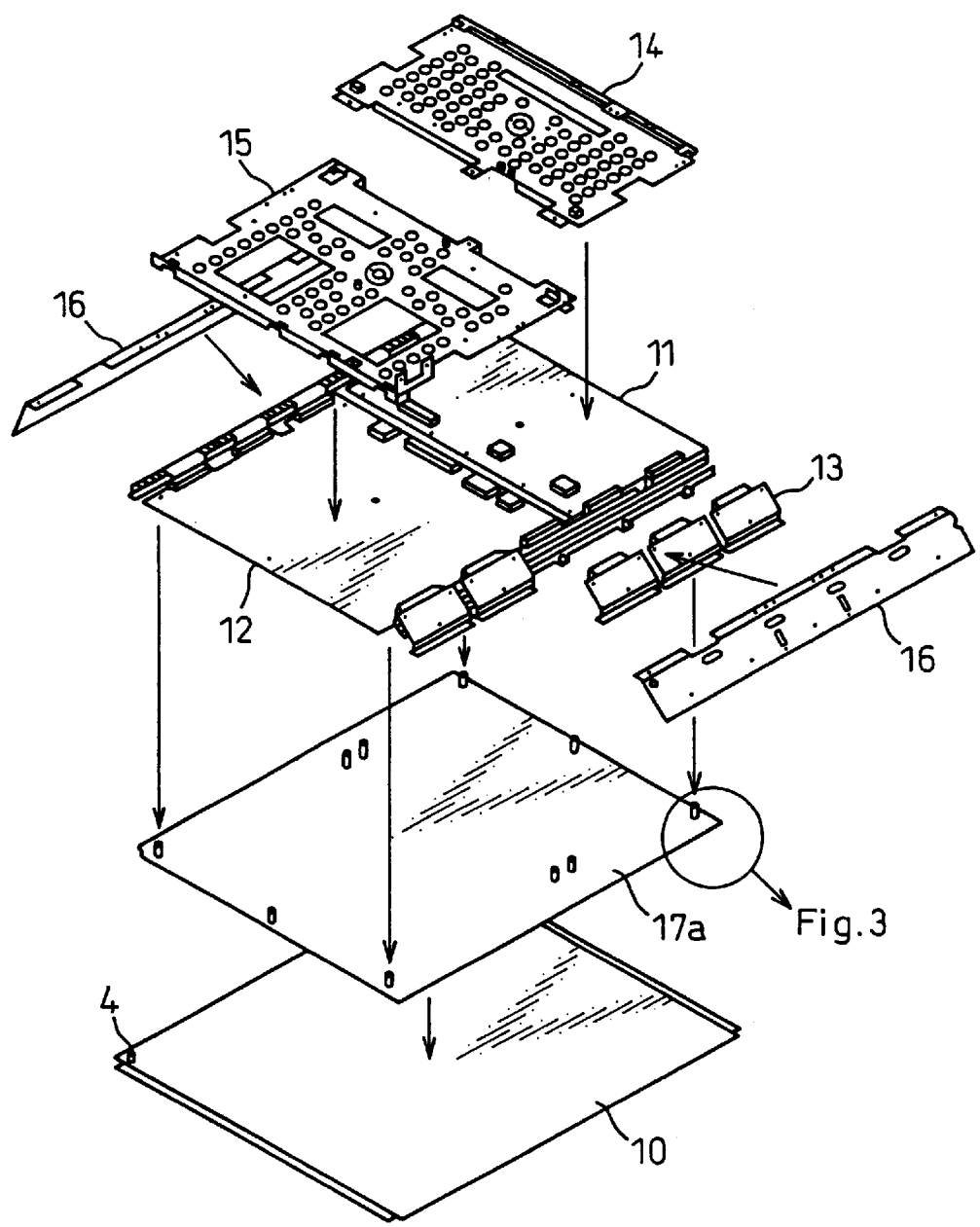
FIG. 2 is an oblique view showing the exploded structure of a conventional plasma display device.

FIG. 2 is an exploded view, in an oblique direction, of a conventional plasma display device which incorporates the PDP shown in FIG. 1. In FIG. 2, reference numeral 10 denotes the PDP shown in FIG. 1, 4 denotes a tip tube used to exhaust the air inside the PDP, 17a denotes a main frame, 11 and 12 denote circuit boards having driving circuits etc. and 13 denotes a driver.

As described above using FIG. 1, PDP 10 is basically made of a pair of glass plates, and therefore, the circuit boards 11 and 12 cannot be directly fixed to PDP 10 with screws. Usually, the circuit boards 11 and 12 are fixed to the main frame 17a made of, for example, a metal plate, and thereafter, the main frame 17a is stuck to PDP 10 with, for example, a double coated adhesive tape. Reference numerals 14 and 15 denote covers for protecting the respective circuit boards 11 and 12, and 16 denotes a driver cover for protecting the driver 13, which driver cover also functions as a heat sink for the driver 13.

Even after the PDP 10 is affixed to the frame 17a, to which circuit boards 11 and 12 have already been attached, a requirement to replace the PDP 10 sometimes occurs, for various reasons, as mentioned in the Description of the Prior Art. Such reasons include a defect found in the attached PDP 10 and a necessity to use a different type of PDP. In such cases, PDP 10 and the frame 17a should be replaced together because frame 17a is not easily separated from PDP 10 once they have been affixed together. The replaced PDP 10 and affixed frame 17a are usually discarded.

On the other hand, main frame 17a, which contacts the PDP 10, is required to absorb the heat generated by PDP 10 quickly and uniformly and move it quickly to the outside of the device. To this end, frame 17a should be made from a material having a large thermal conductivity as well as having a large surface area. However, since a possibility to abandon the frame 17a along with the PDP 10 must be taken in account as mentioned above, a complicated and high cost structure to improve the heat absorption and heat discharge cannot be used for the main frame 17a.

Figure 3:
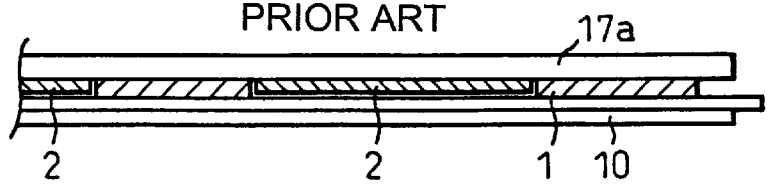
FIG. 3 is a cross-sectional view showing an example of a structure for improving the uniform heat-conduction between a PDP and a main frame.

FIG. 3 is a cross-sectional view showing an example of a structure to improve the uniform heat-conduction between the PDP 10 and the main frame 17a. FIG. 3 is an enlarged view of the circled part shown in FIG. 2.

The frame 17a is affixed to PDP 10 by means of strips of adhesive 1 made of, for example, double coated adhesive tape. The strips of adhesive 1 are arranged at almost equal distances between the frame 17a and PDP 10. In addition, strips of heat-conductive rubber sheet 2 are disposed between strips 1. Since strips of heat-conductive rubber sheet 2 have a high thermal conductivity, they are expected to quickly absorb the heat generated by the PDP 10 and conduct it to the main frame 17a, thus realizing the uniform heat-conduction between the PDP 10 and the main frame 17a. However, this structure does not improve the heat discharge efficiency of the main frame 17a.

Further, since PDP 10 is made of glass plates and the panel size is becoming larger, ensuring the strength of the panel is very important. As mentioned above, however, the main frame 17a has been made from a thin metal plate since it cannot be made to have a complicated and high cost structure. Accordingly, a sufficient mechanical strength of a plasma display device could not be obtained when circuit boards 11 and 12 were simply installed to frame 17a.

Accordingly, the conventional plasma display device usually obtains its mechanical strength from an external framework member to which the plasma display device is installed. Various external framework members are used, depending on the types of apparatuses in which the plasma display device is installed. When the plasma display device is conveyed, it is fastened to a protection member. In such cases, frame 17a and the external framework member are engaged together with, for example, screws via circuit boards 11 and 12 and covers 14 and 15.

However, in the structure mentioned above, since many through holes for the screws cannot be provided on the circuit boards, the conventional plasma display device has a few engaging portions. As a result, the PDP of the conventional plasma display device may easily warp or twist due to an unbalanced load distribution caused by the engaging portions when the device receives an impact from the outside of the device. Therefore, the lack of stiffness has been a serious problem in the conventional plasma display device.

To correct for the lack of stiffness, for example, the main frame 17a is made thick. However, if frame 17a is thickened, it is difficult to maintain the flatness of the main frame 17a. When the main frame 17a is made thin, PDP 10 does not receive a large load even though the flatness of the main frame 17a is low, that is, little warp exists. This does not result in a serious problem. On the contrary, when the main frame is made thick and the panel 10 is affixed to the warped frame 17a, it receives a large load. This results in breakage of the panel.

The plasma display device according to the present invention has a new frame structure which is able to solve the above-mentioned various problems without largely increasing the manufacturing cost of the plasma display device.

Figure 4:
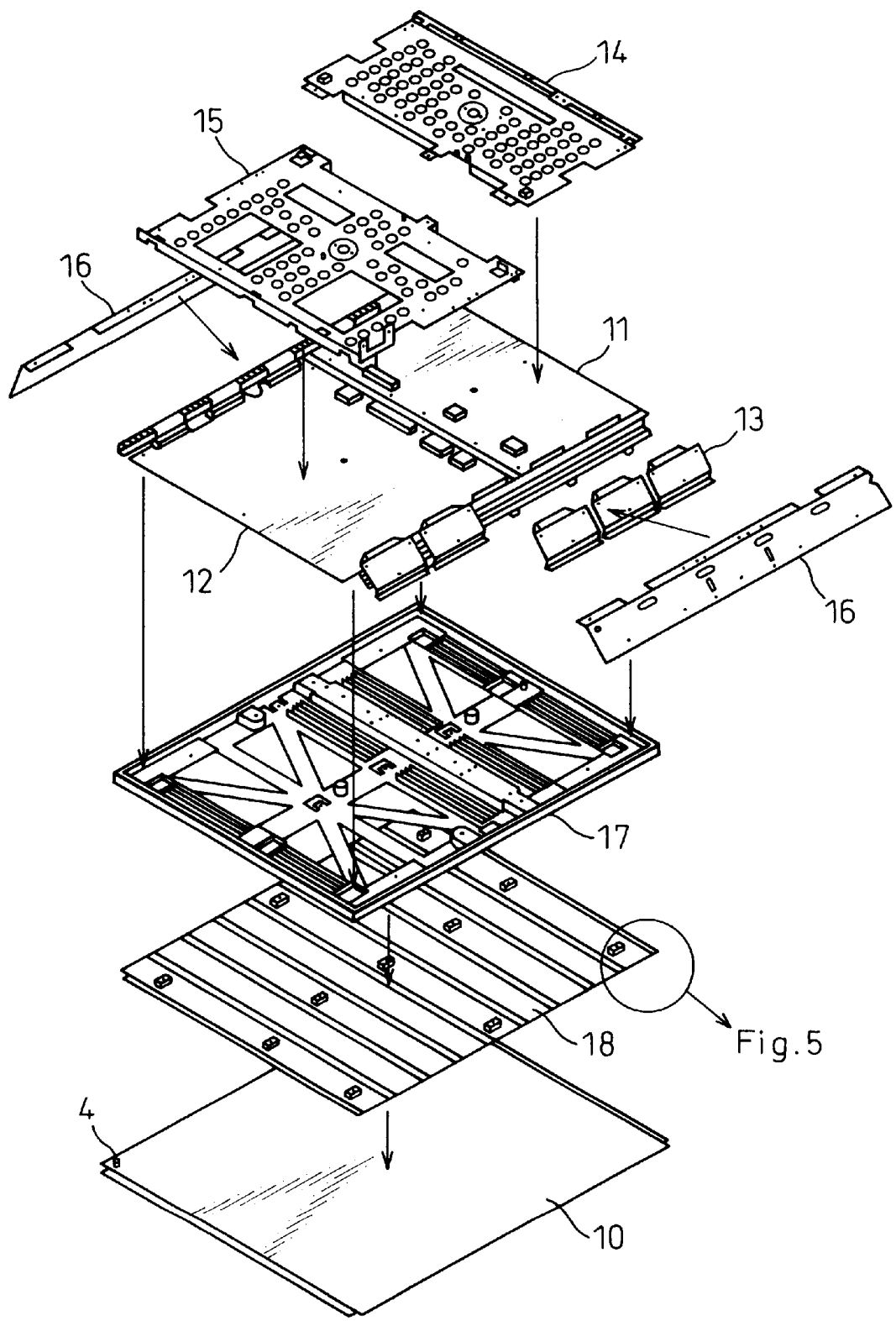
FIG. 4 is an oblique view showing an exploded structure of a plasma display device according to one embodiment of the present invention.

FIG. 4 is an exploded view in an oblique direction of a plasma display device according to the first embodiment of the present invention. The same reference numerals in FIG. 4 as those in FIGS. 2 and 3 identify the same or similar structural elements, and therefore, a detailed explanation of these structural elements will not be given.

In FIG. 4, 17 denotes a main frame and 18 a uniform heat-conducting plate. Plate 18 is supported by the main frame 17 and, at the same time, fixed to PDP 10 by an adhesive. On main frame 17, circuit boards 11 and 12 having, for example, driving circuits, are mounted. Reference numeral 13 denotes a driver provided on the edges of circuit boards 11 and 12. This driver 13 is connected to PDP 10 via a cable (not shown) to drive the respective electrodes formed in PDP 10. Reference numerals 14 and 15 denote protect covers provided to cover the respective circuit boards 11 or 12. Reference numeral 16 denotes a driver cover to protect driver 13. At the same time, it functions as a heat discharge plate to move the heat generated by driver 13 to the outside of the driver. Reference numeral 4 denotes a tip tube for evacuating gas from the inside of PDP 10. A notch is provided on the corresponding portion of plate 18 so that plate 18 does not contact with the tip tube 4 when plate 18 is affixed to PDP 10.

In the conventional plasma display device mentioned above, the possibility of discarding the main frame 17a with PDP 10 has been assumed, and therefore, the main frame 17a could not have a complicated structure which invites an increase of the manufacturing cost. On the contrary, the present invention allows the main frame 17 to have a complicated structure so as to improve its heat discharge ability and mechanical strength by providing the uniform heat-conducting plate 18 between the PDP 10 and the main frame 17.

Since PDP 10 and plate 18 are fixed together by an adhesive, plate 18 will be replaced with PDP 10 when a replacement of the PDP 10 is required. In such a case, main frame 17 can easily be detached from plate 18 so that only PDP 10 and relatively low cost plate 18 must be discarded. Accordingly, by providing the main frame 17 with a structure to improve heat discharge ability and mechanical strength, the present invention can realize a remarkable improvement in the heat discharge ability and the mechanical strength of the plasma display device without largely increasing the manufacturing cost. The uniform heat-conduction between the main frame 17 and the PDP 10 is, of course, maintained by the uniform heat-conducting plate 18.

Figure 5A:
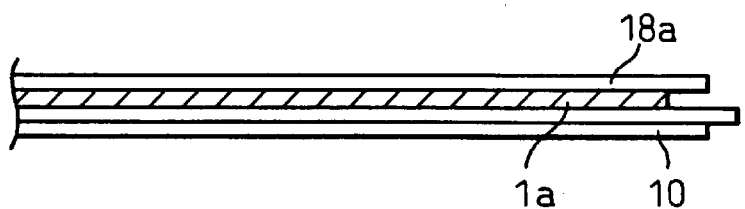
FIG. 5A is a cross-sectional view showing a part of a structure of a uniform heat-conducting plate according to a first embodiment of the present invention.
Figure 5B:
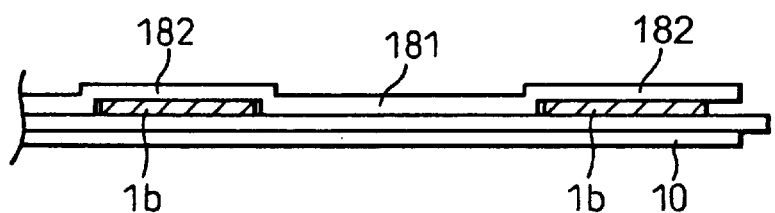
FIG. 5B is a cross-sectional view showing a partial structure of a uniform heat-conducting plate according to a second embodiment of the present invention.
Figure 5C:
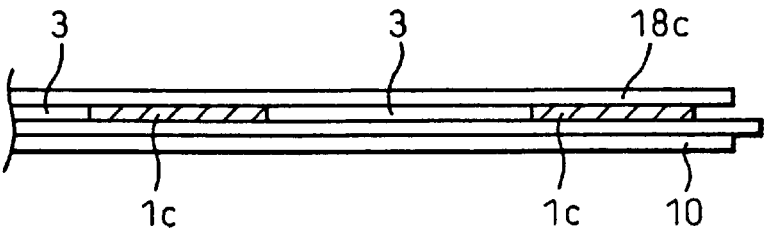
FIG. 5C is a cross-sectional view showing a partial structure of a uniform heat-conducting plate according to a third embodiment of the present invention.

FIGS. 5A to 5C are cross sectional views showing a part of the structure of respective plates 18 according to first to third embodiments of the present invention. These figures show the enlarged structures of the circled part shown in FIG. 4.

FIG. 5A shows a very simple structure in which a rolled aluminum plate 18a is affixed to PDP 10 with an adhesive 1a. Although a uniform layer of adhesive 1a is provided in the structure shown in FIG. 5A, the present invention makes it possible to place a double coated adhesive tape between the plate 18a and PDP 10.

In a case where the adhesive layer is formed on the entire surface of plate 18a, this may result in a cost increase. FIG. 5B shows another example of a plate in which adhesive layers are partly formed between the plate 18b and PDP 10. As shown, plate 18b is comprised of a plurality of stripe-like convex parts 181 and concave parts 182 which are alternately and periodically formed on the plate 18b. This plate 18b contacts with PDP 10 through the convex parts 181. On the other hand, in the concave parts 182, adhesive layers 1b are formed between the plate 18b and PDP 10 so as to affix them together. The adhesive material must have an excellent thermal resistance and thermal conduction, and therefore, a double coated adhesive tape, "VHBTM Acrylic Form Structural Adhesive Tape" made by 3M Co. is used in this embodiment. In the structure shown in FIG. 5B, the double coated adhesive tape is periodically placed so that the tape cost is reduced as compared with the case where the adhesive tape is placed on the entire surface of PDP 10 as shown in FIG. 5A. The convex parts 181 where no adhesive tape is placed may be processed to contact with PDP 10 so as not to form a gap between plate 18b and PDP 10. Ideally, the convex parts 181 are expected to completely contact with PDP 10, however, a small gap depending on the processing accuracy may exist.

Plate 18b may be realized by processing a rolled aluminum plate in a drawing or a press working. In addition, the periodically formed convex and concave parts improve the mechanical strength of the plate 18b. The embodiment shown in FIG. 4 uses plate 18b as the uniform heat-conducting plate 18. From this figure, it is clearly understood that a plurality of convex and concave parts are formed in a stripe form.

Although the present embodiment forms the convex and concave parts in a stripe form periodically, these parts need not always be formed in a stripe form. For example, they may be formed in a lattice form or even more randomly. The form may be changed freely depending on design requirements.

FIG. 5C shows still another example of the uniform heat-conducting plate 18. Reference numeral 18c denotes the uniform heat-conducting plate of this example, the plate 18c which has the same effect as that of the plate 18b shown in FIG. 5A without conducting the drawing or the press working mentioned above. In this example, therefore, spacers 3 are disposed in places corresponding to the convex parts 181 of the plate 18b, that is, between the adhesives 1c. As a result, this example can easily realize a low cost plate because the above mentioned drawing or the press working method is no longer necessary.

In this example, spacers 3 are not limited to the stripe form shown, but any form including square and lattice forms may be applicable.

In the above mentioned three examples of plate 18, the heat generated by the PDP 10 is uniformly conducted to the respective plate 18a, 18b or 18c so that no hot spot is formed on the plate 18. Then the heat is quickly discharged to the outside of the device through the main frame 17 which is attached to the plate 18a, 18b or 18c.

Figure 6A:
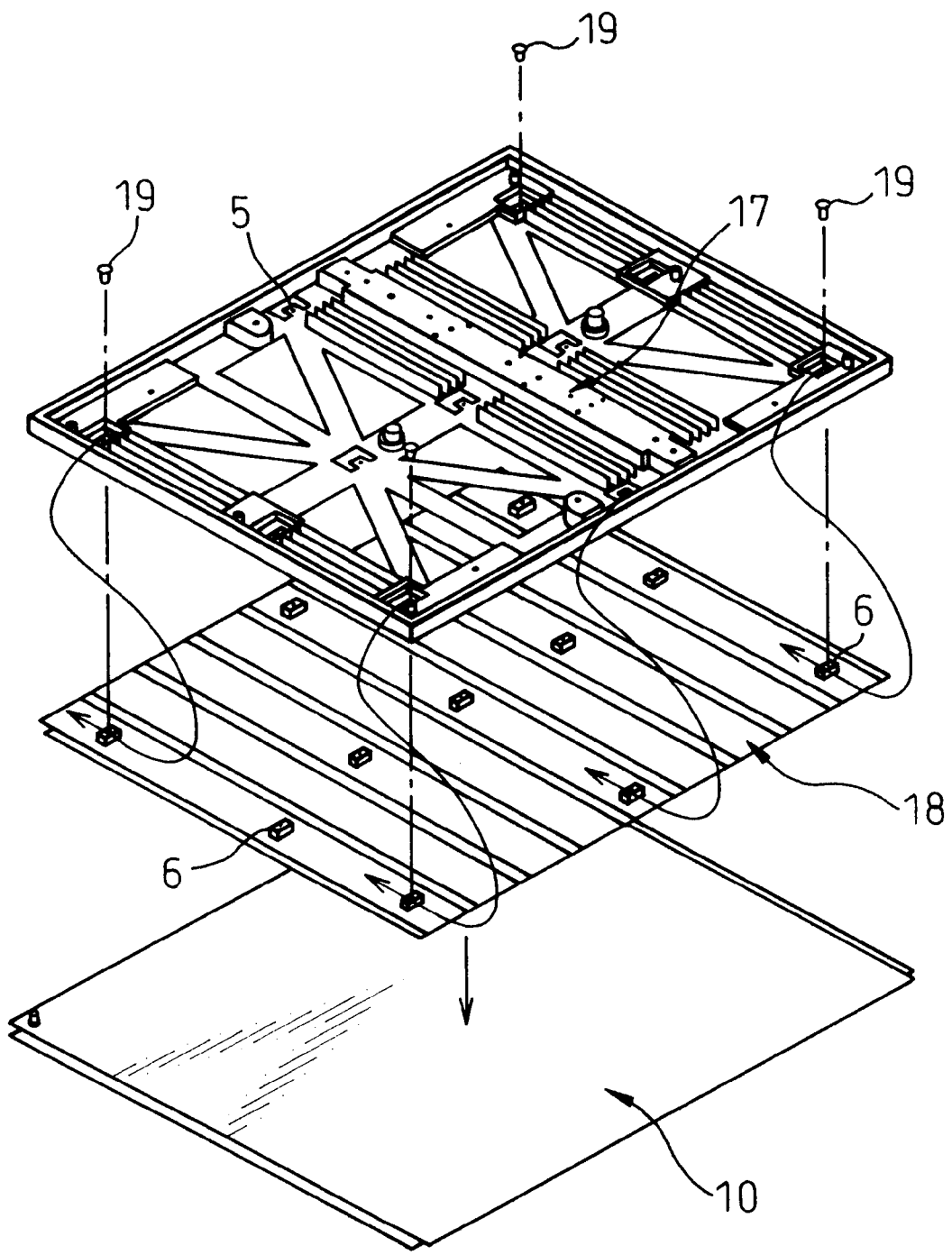
FIG. 6A is an oblique view showing a structure for coupling a PDP with a uniform heat-conducting plate and a main frame according to one embodiment of the present invention.

FIG. 6A is an exploded view, in an oblique direction, of the structure for coupling the main frame and the uniform heat-conducting plate. As mentioned above, the uniform heat-conducting plate 18 may be discarded with PDP 10, and therefore, it cannot have a complicated structure which may increase the cost. However, the embodiment shown in FIG. 4 forms the "complicated structure" on the main frame 17, which support the relatively low cost plate 18, so as to realize the above mentioned various functions.

The main frame 17 of this embodiment has a plurality of tabs 5 (for example, 11, in FIG. 6) which combines main frame 17 with the plate 18. On the other hand, a plurality of sockets 6 are formed on the plate 18 so as to receive the respective tabs 5 formed on the main frame 17. There is also provided a screw hole 7 in each of the tabs 5 and sockets 6.

Figure 6B:
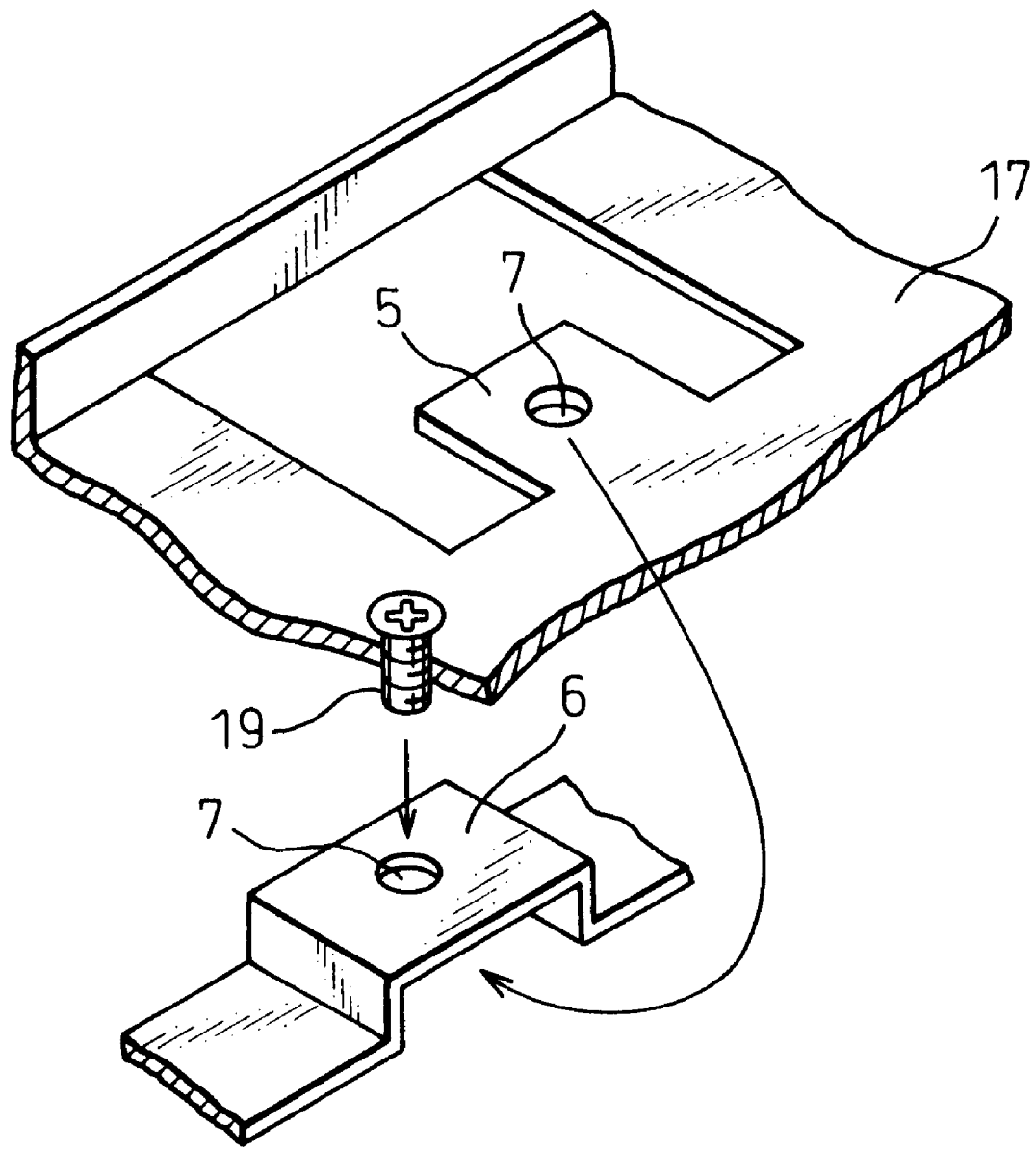
FIG. 6B is an schematic view showing a detailed structure for combining the uniform heat-conducting plate with the main frame shown in FIG. 6A.

FIG. 6B is a view showing the detailed structure how the tab 5 is received by the socket 6 to engage the main frame 17 to the plate 18. To couple the main frame 17 with the plate 18, the main frame 17 is first superposed to the plate 18 in such a way that the corresponding tabs 5 and sockets 6 face to each other. Then, either one of main frame 17 or plate 18 is slid so as to push the tabs 5 into corresponding sockets 6. In this condition, a screw 19 is inserted into the respective screw hole 7 to fix the tab to the socket. As a result, main frame 17 is secured and fixed to plate 18.

In the present invention, main frame 17 is disposed between PDP 10 and circuit boards 11 and 12, and works as a rigid body to improve the mechanical strength of PDP 10. Accordingly, in the present invention, plate 18, which has been affixed to PDP 10, can easily be affixed to the main frame 17, which is a rigid body, through a plurality of engaging portions, thus improving the mechanical strength of the PDP 10. Due to this improvement in mechanical strength, the plasma display device of this invention can uniformly distribute the load caused by an external impact, thus preventing PDP 10 from being bent. Since recent PDPs have a tendency to be made more and more precise, electrodes and rib structures within the panel must be made very fine and precise. Therefore, the unbent structure of the panel is very effective to maintain the high reliability of a plasma display device.

Figure 7A:
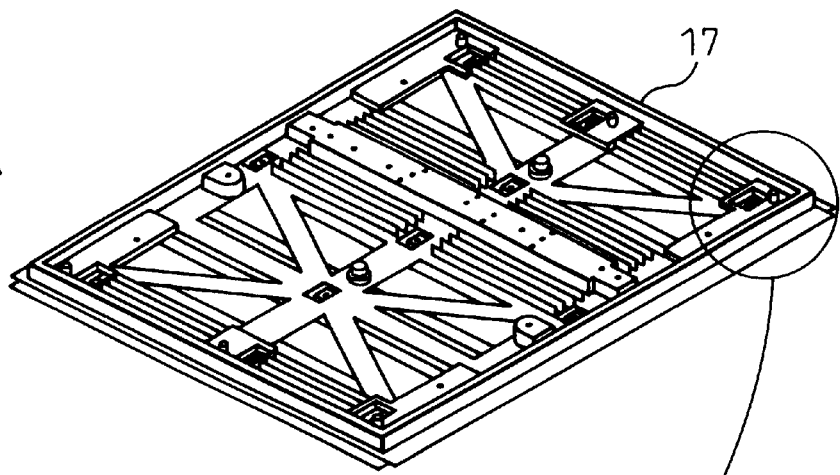
FIG. 7A is an oblique view showing the main frame structure coupled to the uniform heat-conducting plate shown in FIG. 6A.
Figure 7B:
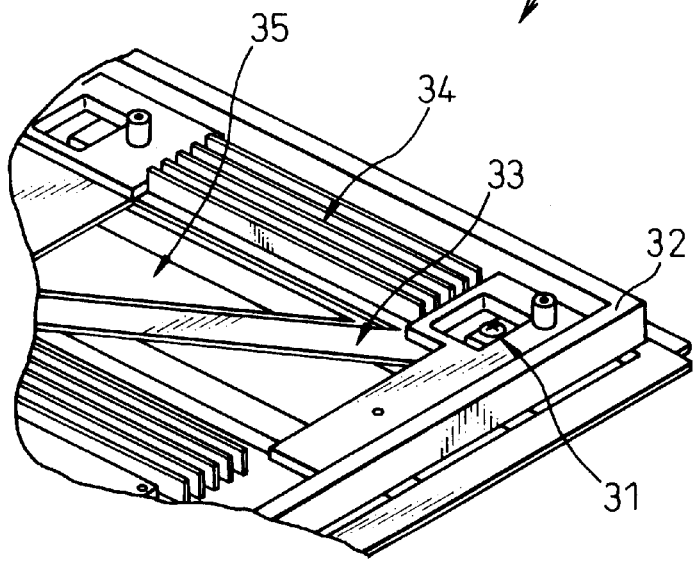
FIG. 7B is an enlarged view showing a part of the main frame structure shown in FIG. 7A.

FIG. 7A is an oblique view showing the structure after the main frame 17 has been fixed to PDP 10 through plate 18. On the other hand, FIG. 7B shows the enlarged structure of the circled part shown in FIG. 7A. In FIG. 7B, reference numeral 31 denotes the secured part where a tab 5 is inserted into a socket 6 and fixed each other by a screw 19. In this embodiment, the total of eleven secured parts 31 are provided on the frame structure such that four of them are on the respective corners, four are on each center of four edges and the remaining three are disposed at equal distances between the secured parts provided on each center of the short edges.

Reference numerals 32 and 33 denote ribs, 34 denotes a radiating fin and 35, 35 . . . denote through holes i.e., open interior spaces in the frame. Rib 32 is formed along the edges of main frame 17 so as to increase the strength of the main frame 17. Due to the rib 32, main frame 17 can be made as thin as possible except the rib part, thus reducing the weight of the main frame 17 without reducing its mechanical strength. Through holes 35 are formed to penetrate the main frame 17, thus further reducing the weight of the main frame 17. Ribs 33 are formed to the main frame 17 along the respective peripheries of the through holes 35 so as to compensate for the decrease in mechanical strength of the main frame 17 due to the formation of the through holes 35.

Radiating fin 34 is provided to effectively move the heat generated by PDP 10 from the main frame 17 to the outside of the device through heat radiation and heat conduction. In this embodiment, eight fins are provided on the main frame 17. In addition to these fins 34, the above mentioned ribs 32 and 33 also work as heat dissipating parts.

In this embodiment, the main frame 17 can have the above mentioned complicated structure having ribs and fins because the uniform heat-conducting plate 18, which may be discarded is provided separately in addition to the main frame. In such a structure, when a necessity arises to change PDP 10 for some reason, since main frame 17 can easily be separated from the uniform heat-conducting plate 18, only PDP 10 and the low cost plate 18 must be replaced.

The main frame 17 having the above mentioned structure can be manufactured by a precut method from an aluminum plate. However, for mass production, an aluminum die casting is preferable.

As mentioned above, the plasma display device according to the present invention is provided with a uniform heat-conducting plate fixed to the plasma display panel and a main frame supported by the uniform heat-conducting plate. Accordingly, the plasma display device of this invention can solve the various problems arriving from the structure for coupling a plasma display panel with a main frame having circuit boards, such as problems concerning the heat dissipation and the mechanical strength of the panel, without largely increasing the manufacturing cost of the plasma display panel.

What is claimed is:

1. A plasma display device comprising:
   a plasma display panel;
   a circuit board having a driving circuit for driving the plasma display panel;
   a main frame for supporting the circuit board; and
   a uniform heat-conducting plate supported by said main frame and fixed to said plasma display panel, said uniform heat-conducting plate comprising a plurality of convex and concave parts, said convex parts being positioned closer to the plasma display panel than said concave parts and said concave parts holding an adhesive affixing the uniform heat-conducting plate to the plasma display panel.

2. The plasma display device according to claim 1, wherein said main frame further comprises a heat dissipating part from which heat generated by the plasma display panel is transferred outside of the main frame.

3. The plasma display device according to claim 2, wherein said heat dissipating part is comprised of a radiating fin.

4. The plasma display device according to claim 1, wherein said main frame further comprises an open space extending through front and back surfaces of the main frame.

5. The plasma display device according to claim 4, wherein said main frame is further comprises a second rib formed along a periphery of said open space.

6. A plasma display device, comprising:
   a plasma display panel;
   a circuit board having a driving circuit for driving the plasma display panel;
   a main frame for supporting the circuit board; and
   a uniform heat-conducting plate supported by said main frame and affixed to said plasma display panel, said uniform heat-conducting plate having on one surface thereof a plurality of spacers adjoining the plasma display panel and said uniform heat-conducting plate being affixed to the plasma display panel by an adhesive disposed between the spacers.

7. A plasma display device, comprising:
   a plasma display panel;
   a circuit board having a driving circuit for driving the plasma display panel;
   a main frame supporting the circuit board;
   a uniform heat-conducting plate supported by said main frame and affixed to said plasma display panel; and
   said main frame having a plurality of tabs and said uniform heat-conducting plate having a plurality of sockets, in each of which sockets a respective tab is inserted so as to engage the respective tabs to said corresponding sockets.

8. The plasma display device according to claim 7, wherein the respective tabs and the corresponding sockets are screwed together in a condition that the respective tabs are inserted into the corresponding sockets.

9. A plasma display device, comprising:
   a plasma display panel;
   a circuit board having a driving circuit for driving the plasma display panel;

a main frame supporting the circuit board and having a first rib formed along a periphery of the main frame; and a uniform heat-conducting plate supported by said main frame and affixed to said plasma display panel.

10. A plasma display device comprising:

a plasma display panel;

a circuit board having a driving circuit for driving the plasma display panel;

a main frame supporting the circuit board; and a uniform heat-conducting plate contacting said plasma display panel;

said uniform heat-conducting plate being affixed to said main frame by screws.

11. The plasma display device according to claim 10, wherein said uniform heat-conducting plate is affixed to said plasma display panel by an adhesive.

12. The plasma display device according to claim 10, wherein one of said main frame and said uniform heat-conducting plate has a tab and the other of said main frame and said uniform heat-conducting plate has a socket into which said tab is inserted, and wherein said socket and said tab, inserted into said socket, are screwed together.

\* \* \* \* \*